(12) United States Patent
Doi et al.

(10) Patent No.: US 11,401,575 B2
(45) Date of Patent: Aug. 2, 2022

(54) SEALING DEVICE

(71) Applicant: JFE Steel Corporation, Tokyo (JP)

(72) Inventors: Takashi Doi, Tokyo (JP); Shoji Kasai, Tokyo (JP); Teruhiko Tobe, Tokyo (JP); Takumi Koyama, Tokyo (JP)

(73) Assignee: JFE Steel Corporation, Tokyo (JP)

( * ) Notice: Subject to any disclaimer, the term of this patent is extended or adjusted under 35 U.S.C. 154(b) by 371 days.

(21) Appl. No.: 16/603,905

(22) PCT Filed: Mar. 29, 2018

(86) PCT No.: PCT/JP2018/013172
§ 371 (c)(1),
(2) Date: Oct. 9, 2019

(87) PCT Pub. No.: WO2018/190140
PCT Pub. Date: Oct. 18, 2018

(65) Prior Publication Data
US 2020/0040425 A1 Feb. 6, 2020

(30) Foreign Application Priority Data

Apr. 13, 2017 (JP) .............................. JP2017-079497

(51) Int. Cl.
*C21D 9/56* (2006.01)
*C21D 1/74* (2006.01)
(52) U.S. Cl.
CPC .............. *C21D 9/565* (2013.01); *C21D 1/74* (2013.01); *C21D 9/561* (2013.01)
(58) Field of Classification Search
CPC ... C21D 1/74; C21D 9/46; C21D 9/56; C21D 9/561; C21D 9/565; F27D 7/06; F27D 99/0073

(Continued)

(56) References Cited

U.S. PATENT DOCUMENTS 5,685,088 A * 11/1997 Nakamura ............ C21D 9/565
34/242
5,938,431 A 8/1999 Thevenet et al.
(Continued)

FOREIGN PATENT DOCUMENTS

CN 1117313 A 2/1996
CN 1252518 A 5/2000
(Continued)

OTHER PUBLICATIONS

Korean Office Action dated Mar. 21, 2021, of counterpart Korean Application No. 10-2019-7029970, along with a Concise Statement of Relevance of Office Action in English.

(Continued)

*Primary Examiner* — Scott R Kastler
*Assistant Examiner* — Michael Aboagye
(74) *Attorney, Agent, or Firm* — DLA Piper LLP (US)

(57) ABSTRACT

A sealing device is installed in heating treatment equipment through which a steel strip passes, the device including a rotary damper which is placed above the steel strip so as to be in contact with the steel strip, and a roll which is placed below the steel strip so that the roll opposes the rotary damper to form a pair consisting of the rotary damper and the roll opposing each other, the steel strip passing through a gap, which is formed between the rotary damper and the roll opposing each other, in which two pairs each of which is the pair consisting of the rotary damper and the roll opposing each other are arranged in tandem in a moving direction of the steel strip in the heating treatment equipment, and an inert gas is fed into a space defined by the two pairs arranged in tandem.

8 Claims, 3 Drawing Sheets

(58) Field of Classification Search
USPC ........ 266/110, 274, 276, 271, 179; 432/242, 432/236, 246
See application file for complete search history.

(56) References Cited

U.S. PATENT DOCUMENTS

| | | | | |
|---|---|---|---|---|
| 6,190,164 B1 * | 2/2001 | Ueno | ............ | C21D 9/565 432/242 |
| 6,341,955 B1 * | 1/2002 | Ueno | ............ | C21D 9/563 432/242 |
| 9,957,585 B2 * | 5/2018 | Takahashi | ............ | C21D 9/005 |

FOREIGN PATENT DOCUMENTS

| | | | | |
|---|---|---|---|---|
| EP | 0685696 | A1 | 12/1995 | |
| EP | 0995807 | A1 | 4/2000 | |
| EP | 0862033 | B1 | 11/2002 | |
| JP | S59-133330 | A | 7/1984 | |
| JP | 63-24038 | A | 2/1988 | |
| JP | S6324038 | * | 2/1988 | ............ C21D 9/565 |
| JP | 6-88135 | A | 3/1994 | |
| JP | 6-88136 | A | 3/1994 | |
| JP | H0688135 | * | 3/1994 | ............ C21D 9/565 |
| JP | 7-268490 | A | 10/1995 | |
| JP | H08-6147 | B2 | 1/1996 | |
| JP | 11-106833 | A | 4/1999 | |
| JP | 2014-20464 | A | 2/2014 | |
| WO | 2016/156125 | A1 | 10/2016 | |

OTHER PUBLICATIONS

The Extended European Search Report dated Jan. 2, 2020, of counterpart European Application No. 18785136.5.
Second Office Action dated Jul. 6, 2021, of counterpart CN Application No. 201880024755.1 with English translation and a Concise Statement of Relevance of Office Action in English.
European Office Action dated Dec. 23, 2020, of counterpart European Application No. 18785136.5.
Office Action dated Jan. 28, 2019, of counterpart Taiwanese Application No. 107112129, along with a Concise Statement of Relevance of Office Action in English.
Office Action dated Nov. 5, 2019, of counterpart Japanese Application No. 2017-079497, along with a Concise Statement of Relevance of Office Action in English.
Chinese Office Action dated Oct. 9, 2020, of counterpart Chinese Application No. 201880024755.1, along with a Search Report in English.

* cited by examiner

SEALING DEVICE

TECHNICAL FIELD

This disclosure relates to a sealing device installed in heating treatment equipment for, for example, steel strips such as steel sheets, in particular, to a sealing device installed in a heat treatment furnace for manufacturing a high-silicon steel (6.5% Si-steel) sheet by using continuous siliconizing treatment equipment having a chemical vapor deposition (hereinafter, referred to as "CVD") treatment furnace.

BACKGROUND

To date, in a heating furnace or a heat treatment furnace for metal materials, the appearance quality or material quality of a heat treated material has been improved by maintaining the furnace atmosphere in a specified state. As an example of a method of improving material quality by performing a heat treatment in a specified furnace atmosphere, for example, Japanese Unexamined Patent Application Publication No. 63-24038 describes a method of manufacturing a high-silicon steel (6.5% Si-steel) sheet by using continuous siliconizing treatment equipment having a CVD treatment furnace.

In the continuous siliconizing treatment equipment, as illustrated in FIG. 1, siliconizing treatment equipment 100 has a furnace body 1 with a refractory-made furnace wall forming a tunnel-like space. A steel strip (steel sheet) S, whose material quality is intended to be improved, is supported by rolls 2 and continuously passes through a heating furnace A, a CVD treatment furnace B, a diffusion treatment furnace C, and a cooling furnace D in this order. At this time, the steel strip S is transported to the CVD treatment furnace B after having been heated in a non-oxidation atmosphere in the heating furnace A to a temperature at which a CVD treatment is performed. A reactant gas containing $SiCl_4$ is fed into the CVD treatment furnace B and sprayed through spray nozzles 3 onto the surface of the steel strip S so that a siliconizing treatment is performed. Subsequently, the steel strip S is transported to the diffusion treatment furnace C and held at a specified soaking temperature so that a Si diffusion treatment is performed in the diffusion treatment furnace C. After such treatments have been performed, the steel strip S is cooled to room temperature or an appropriate temperature in the cooling furnace D and then coiled.

In a heat treatment furnace such as a furnace in continuous siliconizing treatment equipment, it is necessary that, for example, the entrance and exit of each furnace, through which a material passes, be sealed so that the furnace atmosphere is maintained in a specified state. That is, it is necessary that sealing be ensured between the heating furnace A and the CVD treatment furnace B and between the CVD treatment furnace B and the diffusion treatment furnace C. Therefore, as illustrated in FIG. 1, a sealing device 4 is placed between the furnaces.

Regarding an improvement in the sealing capability of such sealing devices, for example, Japanese Unexamined Patent Application Publication No. 7-268490 describes a sealing device having a rotary damper made of a hard material, a roll, and an elevating damper placed above the rotary damper so that the elevating damper is in contact with the rotary damper and seals the furnace interior. In the sealing device, the interaxial distance between the rotary damper and the roll is fixed, and the rotary damper has a portion where the sum of the radii of the rotary damper and the roll is less than the interaxial distance between the rotary damper and the roll. JP '490 describes that, with this, it is possible to control the gap between a steel strip such as a steel sheet and the rotary damper to be very small so that high sealing capability is achieved.

However, in such a sealing device as described in JP '490, when a heat treatment is performed at a high temperature of 1000° C. or higher, eccentricity occurs in a furnace roll placed immediately below the rotary damper. As a result, there is an increase in the size of the gap between the steel strip and the rotary damper, which results in a furnace atmosphere gas leaking through the gap. In addition, there is a deterioration in the properties of refractory materials (fiber) adjacent to the rotary damper or the furnace roll due to $SiCl_4$, which is used for a CVD treatment. This results in a decrease in the thickness and porosity of the refractory material. Therefore, gaps are also formed around the rotary damper and the furnace roll through which the furnace atmosphere gas may leak.

It could therefore be helpful to provide a sealing device with which it is possible to maintain high sealing capability.

SUMMARY

We investigated the sealing capability between the heating furnace A and the CVD treatment furnace B and between the CVD treatment furnace B and the diffusion treatment furnace C and, as a result, found that, in a sealing device as described in JP '490, where a steel strip is sandwiched between a rotary damper and a roll from above and below to achieve sealing capability, it is possible to achieve high sealing capability by arranging two rotary dampers in tandem and by feeding an inert gas such as $N_2$ between the rotary dampers.

We thus provide:

[1] A sealing device installed in heating treatment equipment through which a steel strip passes, the device including a rotary damper which is placed above the steel strip to be in contact with the steel strip, and a roll which is placed below the steel strip so that the roll opposes the rotary damper to form a pair consisting of the rotary damper and the roll opposing each other, the steel strip passing through a gap, which is formed between the rotary damper and the roll opposing each other, in which two pairs each of which is the pair consisting of the rotary damper and the roll opposing each other are arranged in tandem in a moving direction of the steel strip in the heating treatment equipment, and an inert gas is fed into a space defined by the two pairs arranged in tandem.

[2] The sealing device according to item [1], in which the rotary damper has holes which are arranged in a width direction of the steel strip and through which the inert gas is sprayed onto the steel strip.

[3] The sealing device according to item [1] or [2], in which a pressure of the inert gas in the space is set to be 5 $mmH_2O$ to 100 $mmH_2O$.

[4] The sealing device according to any one of items [1] to [3], in which the sealing device is placed in a CVD treatment furnace in the heating treatment equipment.

[5] The sealing device according to any one of items [1] to [4], in which the sealing device is placed on each of an upstream side and a downstream side in the moving direction of the steel strip in the heating treatment equipment.

Since an inert gas is fed into a specified space, sealing capability improves. Therefore, it is possible to inhibit a furnace atmosphere gas from flowing backward. In addition,

Figure 1:
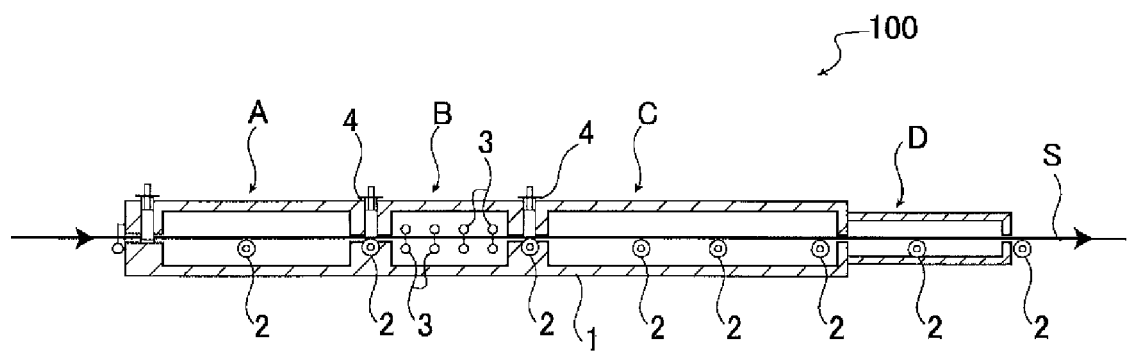
FIG. 1 is a schematic diagram of continuous siliconizing treatment equipment.

REFERENCE SIGNS LIST 1 furnace body
2 roll
3 spray nozzle
4 sealing device
5 rotary damper
6 roll
7 elevating damper
8 dividing plate
9 space
10 hole
100 siliconizing treatment equipment
A heating furnace
B CVD treatment furnace
C diffusion treatment furnace
D cooling furnace
S steel strip (steel sheet)

DETAILED DESCRIPTION

Figure 2:
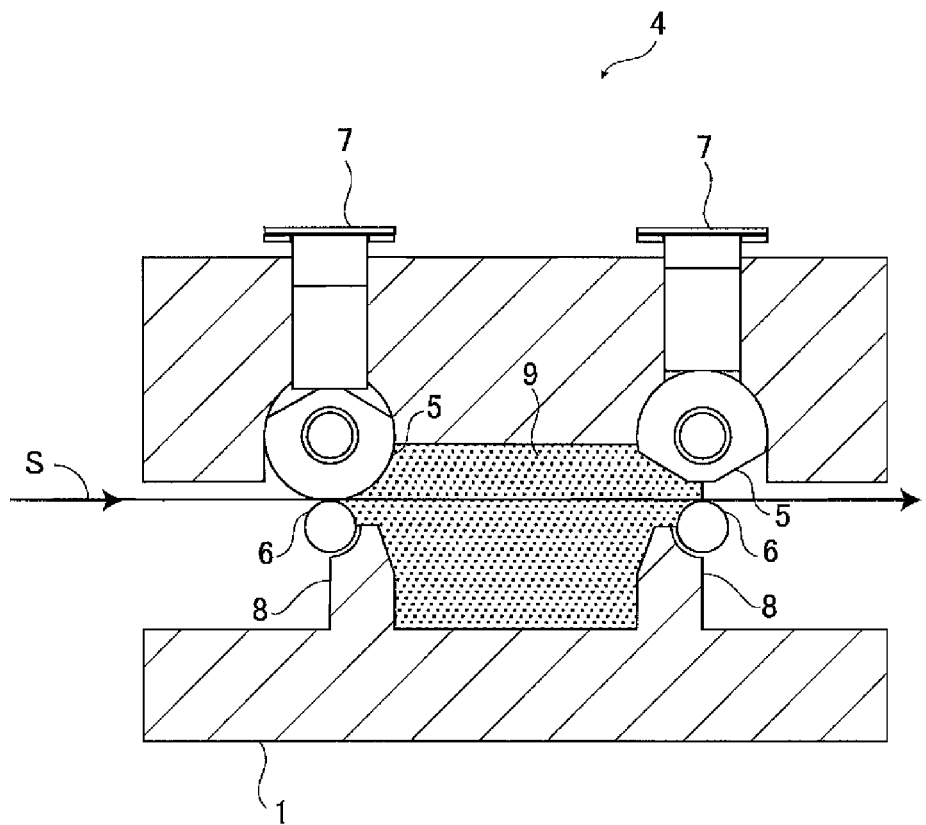
FIG. 2 is a diagram of a sealing device according to an example.

FIG. 2 is a diagram of a sealing device according to an example. A sealing device 4 is installed in a furnace body 1 in siliconizing treatment equipment (heating treatment equipment) 100 and has two pairs, where each pair consists of a rotary damper 5 and a roll 6.

The rotary damper 5 is placed above a steel strip S. The rotary damper 5 is arranged to be rotated in the transverse direction of the furnace body 1, that is, in the longitudinal direction of the steel strip. There is no particular limitation on the shape of the rotary damper 5, and it is sufficient that, as illustrated in FIG. 2, the shape have a cutout portion in the radial direction so that it is possible to control gap size. An elevating damper 7 is placed above the rotary damper 5 to be movable in the up-down direction at the ceiling of the furnace body 1. The rotary damper 5 is rotatable when the elevating damper 7 is raised, and the rotation movement of the rotary damper 5 is appropriately controlled by lowering the elevating damper 7. Therefore, by selecting the position of the cutout portion in the radial direction of the rotary damper 5 so that the distance is secured in accordance with the thickness of the steel strip S to be subjected to a heat treatment, and by fixing the rotary damper 5 by lowering the elevating damper 7 so that the rotary damper 5 is not rotatable, the sealing capability for the steel strip S is appropriately controlled.

The roll 6 is placed below the steel strip S to oppose the rotary damper 5. The roll 6 is a supporting roll that supports the steel strip S in the width direction of the steel strip, and the steel strip S passes through the gap between the rotary damper 5 and the roll 6 opposing each other. In addition, a dividing plate 8, which is a sealing wall, protrudes upward from the floor of the furnace body 1 to oppose the rotary damper 5 and to be in contact with the roll 6.

Two pairs, where each pair consists of the rotary damper 5 and the roll 6, are arranged in tandem in the moving direction of the steel strip. That is, as illustrated in FIG. 2, two pairs each of which consists of the rotary damper 5 and the roll 6 are arranged in tandem in the moving direction of the steel strip. As illustrated in FIG. 2, an inert gas is fed into a space 9 defined by the two pairs, each of which consists of the rotary damper 5 and the roll 6, arranged in tandem. By filling the space 9 with the inert gas, the pressure in the space 9 is maintained higher than that in the furnace, and thus there is an improvement in sealing capability, which results in an atmosphere gas in the furnace being prevented from flowing backward into another furnace. In addition, since it is possible to maintain sealing capability to a certain level, it is possible to inhibit a deterioration in the properties of refractory materials (fiber) adjacent to the rotary dampers or the furnace rolls due to $SiCl_4$, which is used for a CVD treatment. Therefore, it is possible to decrease the replacement frequency of the devices such as furnace rolls and the repairing frequency of refractory materials adjacent to the devices.

Although there is no particular limitation on the inert gas fed into the space 9, it is preferable that such an inert gas be $N_2$. In addition, there is no particular limitation on the method used to feed the inert gas, and it is sufficient that, for example, feeding ports (not illustrated) for the inert gas be made in the side wall of the furnace body 1 to feed the inert gas into the space 9.

It is preferable that the rotary damper 5 have holes 10 through which the inert gas is sprayed onto the steel strip S and are arranged in the width direction of the steel strip S. By spraying the inert gas onto the steel strip S through the holes 10 of the rotary damper 5, it is possible to seal the gap between the rotary damper 5 and the steel strip S with a curtain of the inert gas. As a result, it is possible to achieve higher sealing capability.

Regarding the disposition of the holes 10 through which the inert gas is sprayed, it is sufficient that plural holes be disposed in the width direction of the steel strip. In addition, there is no particular limitation on the arrangement of the holes 10, and examples of the arrangement of the holes 10 include an arrangement in tandem, an arrangement in a zig-zag manner, and an arrangement in multiple lines.

Figure 3:
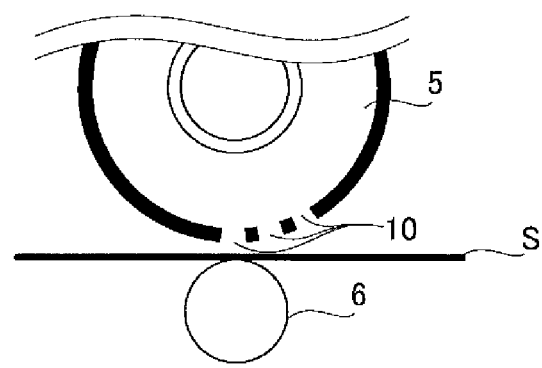
FIG. 3 is an enlarged view of the sealing device according to the example.

FIG. 3 illustrates an example of an arrangement in multiple lines. In addition, there is no particular limitation on the shape of the holes 10, and examples of the shape include a circular shape, an elliptical shape (having a major axis in the width direction), and a slit hole-like shape. In addition, there is no particular limitation on the method used to feed the inert gas to the rotary damper 5, and it is sufficient that, for example, the inert gas be fed from the rotation axis (not illustrated) of the rotary damper 5 and sprayed through the holes arranged on the body of the rotary damper 5.

When the pressure of the inert gas sprayed through the holes 10 is excessively high or the temperature of the inert gas is excessively low, there is a risk of a negative effect of, for example, deformation occurring in the steel strip, which is subjected to a heat treatment at a high temperature of 1000° C. or higher. Therefore, it is preferable that the pressure and temperature of the inert gas sprayed through the holes of the rotary damper 5 onto the steel strip be respectively 100 mmH$_2$O or lower and 1000° C. or higher.

It is preferable that the pressure of the inert gas in the space 9 be set to be 5 mmH$_2$O to 100 mmH$_2$O. When the pressure in the space 9 is lower than 5 mmH$_2$O, the pressure is too low to be controlled. On the other hand, when the pressure in the space 9 is higher than 100 mmH$_2$O, it is difficult to maintain such high pressure because of a gap between the rotary damper 5 and the steel strip S. It is more preferable that the pressure be 10 mmH$_2$O to 50 mmH$_2$O.

It is preferable that the sealing device 4 be placed in the CVD treatment furnace B in the siliconizing treatment equipment 100. As described above, a reactant gas containing SiCl$_4$ is fed into the CVD treatment furnace B and sprayed through spray nozzles 3 onto the surface of the steel strip S so that a siliconizing treatment is performed. When a siliconizing treatment is performed, the atmosphere gas in this CVD treatment furnace B contains iron chloride (gas) as a byproduct. When such an atmosphere gas containing iron chloride (gas) in the CVD treatment furnace flows backward, since the atmosphere gas is cooled in the heating furnace A and the diffusion heat treatment furnace C, iron chloride coheres and adheres to the steel strip S at a temperature of lower than 1100° C., which results in an increase in the defect occurrence rate due to a deterioration in the surface appearance quality of a product. Therefore, by placing the sealing device in the CVD treatment furnace B, it is possible to maintain high sealing capability, and thus it is possible to prevent the atmosphere gas in the CVD treatment furnace B from flowing backward. As a result, it is possible to prevent a deterioration in yield due to the adhesion of iron chloride.

Figure 4:
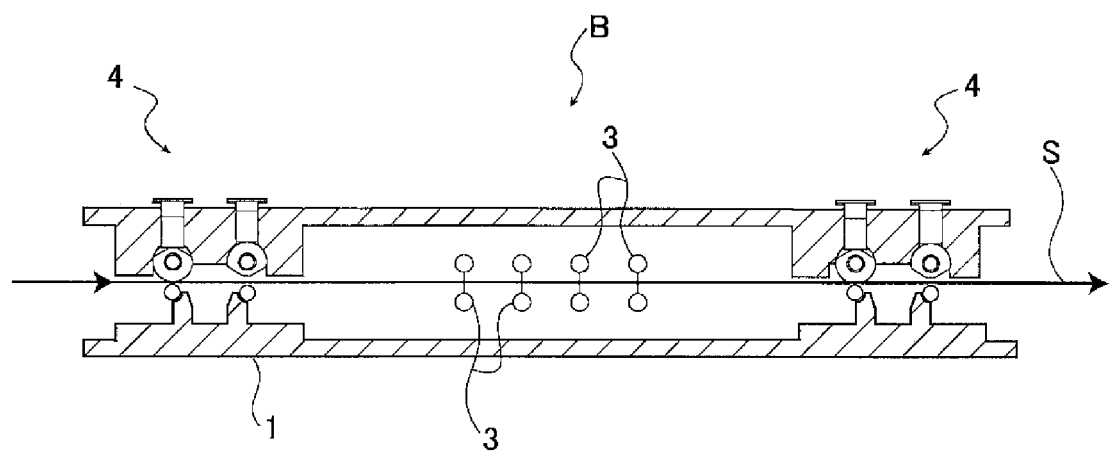
FIG. 4 is a diagram of a sealing device according another example.

In addition, it is preferable that the sealing device 4 be placed on each of the upstream side and the downstream side in the moving direction of the steel strip. By placing the sealing devices on both the upstream side and the downstream side, it is possible to prevent the atmosphere gas in the furnace from flowing backward into other furnaces. It is more preferable that the sealing devices 4 be placed on both the upstream side and downstream side of the CVD treatment furnace B in the moving direction of the steel strip (refer to FIG. 4). By placing the sealing devices 4 on both the upstream side and downstream side of a siliconizing treatment process as illustrated in FIG. 4, there is an increase in the effect of preventing the atmosphere gas in the CVD treatment furnace B from flowing backward, and there is an increase in the effect of preventing a deterioration in yield due to the adhesion of iron chloride.

Although there is no particular limitation on the number of the sealing devices 4 placed, it is preferable that the number be about 2 to 3 from the viewpoint of facility conditions and maintenance.

It is sufficient that the rotary damper 5 be made of, for example, a hard material. In addition, although there is no particular limitation on, for example, the shape of the rotary damper 5, it is sufficient that the rotary damper 5 be rotatably buried in the ceiling of the furnace body 1 so that part of the outer peripheral surface of the rotary damper 5 is exposed inside the furnace body 1. In addition, it is sufficient that the rotary damper 5 be placed above the roll 6 in a vertical direction to be parallel to the roll 6.

In addition, from the viewpoint of significantly decreasing gap size, thereby achieving a perfectly sealed state, it is preferable that, as described in JP '490, the interaxial distance between the rotary damper 5 and the roll 6 be fixed and that the rotary damper 5 have a portion where the sum of the radii of the rotary damper 5 and the roll 6 is less than the interaxial distance between the rotary damper 5 and the roll 6.

In addition, there is no particular limitation on the elevating damper 7. It is sufficient that, for example, the elevating damper 7 be made of ceramic fiber having a flashboard-like shape and placed above the rotary damper 5 to be parallel to and contactable with the rotary damper 5 and to be movable in the up-down direction at the ceiling of the furnace body 1.

Example 1

A steel strip having a thickness of 0.1 mm was subjected to a siliconizing treatment in continuous siliconizing treatment equipment having an equipment configuration as illustrated in FIG. 1 by using a treatment gas including SiCl$_4$ to manufacture a high-silicon steel (6.5 mass % Si-steel) strip. At this time, the sealing device as illustrated in FIG. 2 was used as a sealing device. Two pairs, where each pair consists of the rotary damper 5 and the roll 6, were located on the upper stream side of the CVD treatment furnace B while another two pairs were placed on the downstream side thereof.

In the space 9, which was defined by the rotary dampers 5 and the rolls 6, a pressure of 30 mmH$_2$O was maintained. This pressure was higher than the pressure (20 mmH$_2$O) in the heating furnace A, the CVD treatment furnace B, and the diffusion treatment furnace C.

A defect occurrence rate due to the adhesion of iron chloride to the surface of the steel strip caused by the backward flow of the atmosphere gas was determined. The method used to determine the defect occurrence rate was as follows.

Defect Occurrence Rate

When a defect occurred, a length of 1 m centered at the position of the defect was defined as a defect length, the defect occurrence rate was defined as a value obtained by dividing the sum of the defect lengths in one coil by the coil length, and the average defect occurrence rate value for ten coils was calculated and used for comparison.

The sealing device according to JP '490 was used as a conventional sealing device (comparative example), the defect occurrence rate of the conventional sealing device was defined as 1, and the ratio of the defect occurrence rate of our sealing device to the defect occurrence rate of the comparative example was calculated and used for comparison. The comparison result is illustrated in FIG. 5.

Figure 5:
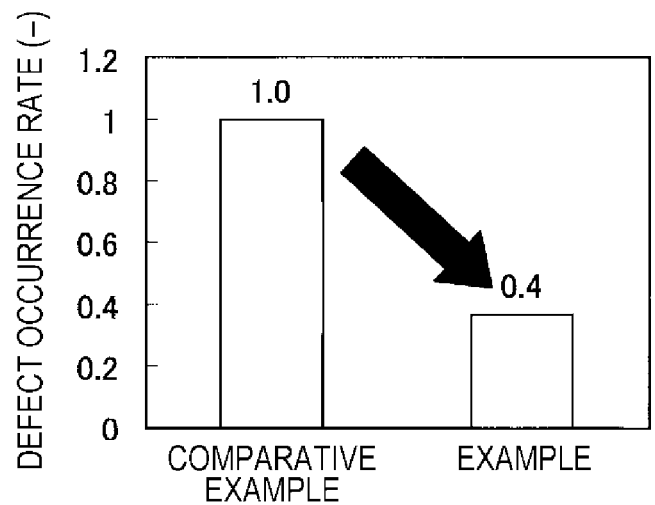
FIG. 5 is a graph illustrating the comparison in terms of defect occurrence rate between when our sealing device is used and when a conventional sealing device is used.

As indicated in FIG. 5, when our sealing device was used (the example), there was a decrease in the defect occurrence rate to 0.4 times that of the comparative example. Therefore, by using the sealing device, there is an improvement in sealing capability, and thus it is possible to decrease the defect occurrence rate.

Example 2

By manufacturing a high-silicon steel strip as in EXAMPLE 1, the replacement cycle of the used rotary damper was investigated. Replacement timing was defined as a point in time when the difference in pressure between the furnace zone defined by the two sealing devices and the furnace zone upstream or downstream of the furnace zone defined by the two sealing devices continuously became 5 mmH$_2$O or less. The replacement cycle of the rotary damper of the conventional sealing device (before modification) was defined as 1, and the ratio of the replacement cycle of the rotary damper of our sealing device to the replacement cycle of the rotary damper of the conventional sealing device was calculated and used for comparison. The comparison result is illustrated in FIG. 6.

Figure 6:
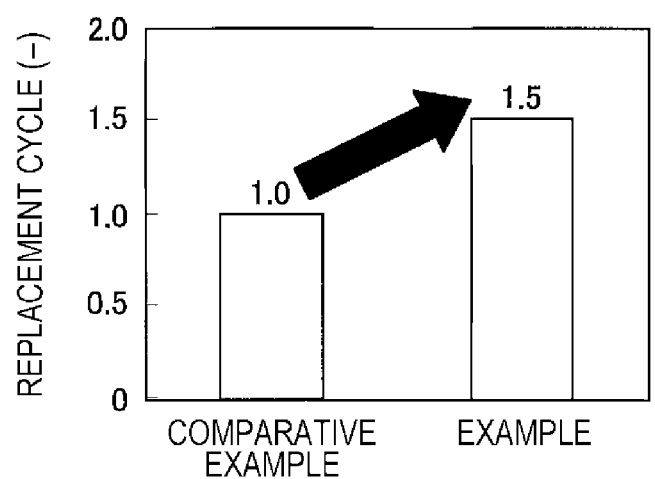
FIG. 6 is a graph illustrating the comparison in terms of the replacement cycle of a rotary damper between when our sealing device is used and when a conventional sealing device is used.

As indicated in FIG. 6, when our sealing device was used (the example), there was an increase in replacement cycle to 1.5 times that of the comparative example. Therefore, by using our sealing device, there is an improvement in sealing capability, and thus it is possible to decrease replacement frequency.

The invention claimed is:

1. A sealing device installed in heating treatment equipment through which a steel strip passes, the device comprising:
   a rotary damper placed above the steel strip to be in contact with the steel strip; and
   a roll placed below the steel strip so that the roll opposes the rotary damper to form a pair consisting of the rotary damper and the roll opposing each other, the steel strip passing through a gap formed between the rotary damper and the roll opposing each other,
   wherein two pairs each of which is the pair consisting of the rotary damper and the roll opposing each other are arranged in tandem in a moving direction of the steel strip in the heating treatment equipment, an inert gas is fed into a space defined by the two pairs arranged in tandem, and the rotary damper is made of a hard material that has holes arranged in a width direction of the steel strip and through which the inert gas is sprayed onto the steel strip to seal the space defined between the two pairs arranged in tandem.

2. The sealing device according to claim 1, wherein a pressure of the inert gas in the space is 5 mmH$_2$O to 100 mmH$_2$O.

3. The sealing device according to claim 1, wherein the sealing device is placed in a CVD treatment furnace in the heating treatment equipment.

4. The sealing device according to claim 1, wherein the sealing device is placed on each of an upstream side and a downstream side in the moving direction of the steel strip in the heating treatment equipment.

5. The sealing device according to claim 2, wherein the sealing device is placed in a CVD treatment furnace in the heating treatment equipment.

6. The sealing device according to claim 2, wherein the sealing device is placed on each of an upstream side and a downstream side in the moving direction of the steel strip in the heating treatment equipment.

7. The sealing device according to claim 3, wherein the sealing device is placed on each of an upstream side and a downstream side in the moving direction of the steel strip in the heating treatment equipment.

8. The sealing device according to claim 5, wherein the sealing device is placed on each of an upstream side and a downstream side in the moving direction of the steel strip in the heating treatment equipment.

* * * * *